United States Patent
Lowney et al.

(10) Patent No.: US 9,343,418 B2
(45) Date of Patent: May 17, 2016

(54) SOLDER BUMP ARRANGEMENTS FOR LARGE AREA ANALOG CIRCUITRY

(71) Applicant: Xilinx, Inc., San Jose, CA (US)

(72) Inventors: Donnacha Lowney, Dublin (IE);
Marites De La Torre, Dublin (IE);
Christopher M. Gorman, Galway (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/071,865

(22) Filed: Nov. 5, 2013

(65) Prior Publication Data

US 2015/0123265 A1 May 7, 2015

(51) Int. Cl.
*H01L 23/00* (2006.01)
*H01L 25/065* (2006.01)

(52) U.S. Cl.
CPC ............... *H01L 24/14* (2013.01); *H01L 24/11* (2013.01); *H01L 25/0652* (2013.01); *H01L 25/0655* (2013.01); *H01L 25/0657* (2013.01); *H01L 24/13* (2013.01); *H01L 24/16* (2013.01); *H01L 24/17* (2013.01); *H01L 24/81* (2013.01); *H01L 2224/131* (2013.01); *H01L 2224/1416* (2013.01); *H01L 2224/14131* (2013.01); *H01L 2224/14132* (2013.01); *H01L 2224/14133* (2013.01); *H01L 2224/14163* (2013.01); *H01L 2224/16145* (2013.01); *H01L 2224/16225* (2013.01); *H01L 2224/16227* (2013.01); *H01L 2224/17181* (2013.01); *H01L 2224/17517* (2013.01); *H01L 2224/81801* (2013.01); *H01L 2225/06513* (2013.01); *H01L 2225/06517* (2013.01); *H01L 2225/06544* (2013.01); *H01L 2225/06568* (2013.01); *H01L 2924/1425* (2013.01); *H01L 2924/3511* (2013.01)

(58) Field of Classification Search
CPC . H01L 24/14; H01L 25/0652; H01L 25/0655; H01L 25/0657; H01L 24/11; H01L 23/66; H01L 23/50
See application file for complete search history.

(56) References Cited

U.S. PATENT DOCUMENTS

| | | | | |
|---|---|---|---|---|
| 6,323,559 | B1 * | 11/2001 | Chan et al. | 257/778 |
| 6,489,905 | B1 | 12/2002 | Lee | |
| 6,938,335 | B2 * | 9/2005 | Kuribayashi | H05K 13/0465 257/777 |
| 7,052,968 | B1 * | 5/2006 | Lee | H01L 23/544 257/797 |
| 8,581,399 | B2 * | 11/2013 | Tsai et al. | 257/737 |
| 8,803,339 | B1 * | 8/2014 | Azeroual | 257/786 |
| 9,089,060 | B1 * | 7/2015 | Azeroual | H05K 1/114 |
| 2002/0121679 | A1 * | 9/2002 | Bazarjani et al. | 257/666 |

(Continued)

FOREIGN PATENT DOCUMENTS

JP 2009-076695 4/2009
WO WO 2010/114798 10/2010

OTHER PUBLICATIONS

Bonfanti A et al, "A 2.5-GHz DDFS-PLL With 1.8-MHz Bandwidth in 0.35-µm CMOS", IEEE Journal of Solid-State Circuits, vol. 43, No. 6, pp. 1403-1413, Jun. 2008.

(Continued)

*Primary Examiner* — Jarrett Stark
*Assistant Examiner* — Bitew Dinke
(74) *Attorney, Agent, or Firm* — Kevin T. Cuenot

(57) ABSTRACT

An integrated circuit (IC) can include an analog region of a die of the IC. The analog region includes analog circuitry. The IC further includes a plurality of solder bumps implemented on a surface of the die in an area in vertical alignment with the analog region of the die.

20 Claims, 7 Drawing Sheets

(56) References Cited

U.S. PATENT DOCUMENTS

| | | | |
|---|---|---|---|
| 2003/0042619 A1* | 3/2003 | Huang | 257/778 |
| 2003/0122259 A1* | 7/2003 | Bobba | H01L 23/528 257/773 |
| 2006/0017172 A1* | 1/2006 | Burton | 257/773 |
| 2006/0103421 A1* | 5/2006 | Hirata | 326/62 |
| 2007/0289771 A1* | 12/2007 | Osaka et al. | 174/250 |
| 2009/0166856 A1 | 7/2009 | Iwata | |
| 2010/0109052 A1 | 5/2010 | Nakajima et al. | |
| 2010/0133589 A1 | 6/2010 | Aruga et al. | |
| 2010/0246152 A1 | 9/2010 | Lin | |
| 2010/0258905 A1* | 10/2010 | Song et al. | 257/532 |
| 2010/0276572 A1* | 11/2010 | Iwabuchi et al. | 250/208.1 |
| 2011/0056865 A1* | 3/2011 | Dikselis et al. | 206/564 |
| 2011/0304008 A1 | 12/2011 | Yang | |
| 2011/0316572 A1* | 12/2011 | Rahman | 324/754.03 |
| 2012/0001327 A1* | 1/2012 | Zhou et al. | 257/738 |
| 2012/0161279 A1* | 6/2012 | Lin et al. | 257/531 |
| 2012/0293972 A1* | 11/2012 | Pan et al. | 361/772 |
| 2013/0234315 A1* | 9/2013 | Daubenspeck | H01L 22/12 257/737 |
| 2013/0265736 A1* | 10/2013 | Rokuhara | 361/783 |
| 2013/0299977 A1* | 11/2013 | Dayringer | H01L 25/0652 257/738 |
| 2014/0084477 A1* | 3/2014 | Erdmann et al. | 257/774 |
| 2014/0253171 A1* | 9/2014 | Lowney et al. | 324/762.02 |
| 2014/0264847 A1* | 9/2014 | Takahashi | 257/737 |
| 2014/0374877 A1* | 12/2014 | Oh | H01L 23/5223 257/532 |
| 2015/0084186 A1* | 3/2015 | Chang | H01L 24/14 257/737 |

OTHER PUBLICATIONS

Lee D-H et al, "Nyquist-Rate Current-Steering Digital-to-AnalogConverters With Random Multiple Data-Weighted Averaging Technique and ct' Rotated Walk Switching Scheme", IEEE Transactions on Circuits and Systems II: Expr ESS Briefs, vol. 53, No. 11, pp. 1264-1268, Nov. 2006.

Wikipedia, "Common-centroid-Layout", Apr. 2, 2013, Retrieved from the Internet : URL:https ://de.wikipedia.org/w/index.php?title=Common• centroid-Layout&oldid= 116637438, 1 page.

Kanantharana, J. et al., "Examination of mechanical stresses in silicon substrates due to lead-tin solder bumps via micro-Raman spectroscopy and finite element modeling", Semiconductor Science and Technology, 17, pp. 1255-1260, Nov. 7, 2002.

Schafferer, B. et al., "A 3V CMOS 400mW 14b 1.4GS/s DAC for Multi-Carrier Applications", ISSCC 2004, Session 20, Digital-To-Analog Converters, 20.1, 10 pages, 2004, Analog Devices, Wilmington, MA.

Van Der Plas, Geert A. M. et al., "A 14-bit Intrinsic Accuracy Q2 Random Walk CMOS DAC", IEEE JSSC, vol. 34, No. 12, pp. 1708-1718, Dec. 1999.

\* cited by examiner

SOLDER BUMP ARRANGEMENTS FOR LARGE AREA ANALOG CIRCUITRY

FIELD OF THE INVENTION

This disclosure relates to integrated circuits (ICs) and, more particularly, to solder bump arrangements used with large area analog circuitry of an IC.

BACKGROUND

Portions of integrated circuits (ICs) that include analog circuitry are often viewed as highly sensitive. These areas of the IC may be affected by electrical, thermal, and mechanical gradients. Designing high performance analog circuitry is dependent upon effectively dealing with these gradients, particularly for analog circuitry that occupies a large area of the IC.

As an example, consider a current source used in a digital-to-analog converter (DAC). The current source may occupy a large area of the IC. For example, a "current steering" type of DAC typically includes a current source occupying a large area and a plurality of current steering switches that route current to selected outputs depending on the digital code that is input or provided. Often, the current source is made from an array of unit transistors. The size of the current source may be on the order of square millimeters. A high performance DAC must cancel out electrical, thermal, and mechanical gradients that occur with the IC, else linearity of the DAC is degraded.

Wire bonded packages are frequently used for packaging ICs with large portions of analog circuitry. In a wire bonded package, bond pads are distributed around the periphery of the IC thereby avoiding placement of bond pads over the sensitive analog circuitry. As flip-chip technologies become more prevalent, however, reliable mechanical attachment of a die to another structure such as a package substrate or an interposer requires a minimum density of solder bumps. Modern ICs implemented using flip-chip technologies avoid using solder bumps over sensitive analog circuitry to avoid degrading performance of the analog circuitry. Avoiding bump formation over such large portions of the IC, however, may violate minimum density design rules for IC fabrication and is problematic for the structural integrity of the resulting IC.

SUMMARY

In one aspect, an integrated circuit (IC) includes an analog region of a die of the IC. The analog region includes analog circuitry. The IC further includes a plurality of solder bumps implemented on a surface of the die. The plurality of solder bumps is in an area in vertical alignment with the analog region of the die.

In another aspect, a method for manufacturing an integrated circuit is described. The method for manufacturing includes implementing an analog region within a die of the integrated circuit. The analog region includes analog circuitry. The method of manufacturing includes locating a plurality of solder bumps on a surface of the die. The plurality of solder bumps are in an area on the surface of the die in vertical alignment with the analog region of the die.

BRIEF DESCRIPTION OF THE DRAWINGS

FIGS. 3-1, 3-2, 3-3, and 3-4 are block diagrams illustrating layouts for an analog region of the IC of FIGS. 1 and 2.

FIG. 4 is a bottom view of a portion of the region of FIG. 3.

DETAILED DESCRIPTION OF THE DRAWINGS

Figure 1:
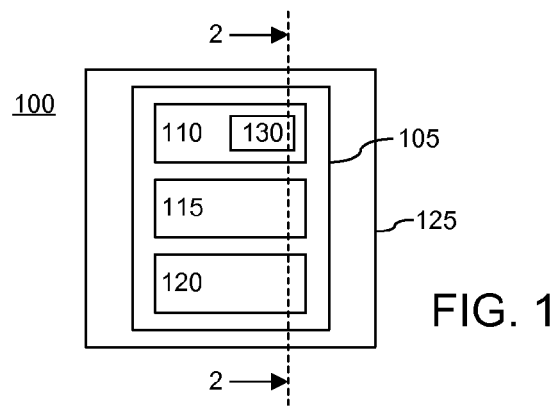
FIG. 1 is a block diagram illustrating a top view of an exemplary multi-die integrated circuit (IC).

While the disclosure concludes with claims defining novel features, it is believed that the various features described herein will be better understood from a consideration of the description in conjunction with the drawings. The process (es), machine(s), manufacture(s) and any variations thereof described within this disclosure are provided for purposes of illustration. Any specific structural and functional details described are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to solder bump arrangements used with large area analog circuitry of an IC. Typically, analog circuitry of an IC is sensitive to a variety of factors including, but not limited to, electrical, thermal, and mechanical gradients within the IC. Solder bumps are widely used in flip-chip IC designs to join dies together. Solder bumps further are known to induce a mechanical gradient with the dies in the form of varying stress in and around each solder bump. The stress induced by a solder bump may adversely affect devices implemented within the dies and, in consequence, the performance of any circuits utilizing or relying upon such devices.

Accordingly, conventional design techniques avoid placement of solder bumps in vertical alignment with large regions of analog circuitry in flip-chip IC designs. The region occupied by analog circuitry of an IC, however, may be so large that avoiding placement of solder bumps in vertical alignment with the region violates design rules specifying minimum solder bump density requirements. Violation of such design rules may also adversely affect performance and structural integrity of the IC. For example, without adequate solder bump density, bowing in one or more dies of the IC may occur.

In accordance with the inventive arrangements described within this disclosure, solder bump arrangements are disclosed that may be implemented in vertical alignment with regions of an IC that include analog circuitry. By utilizing solder bump arrangements as disclosed herein, flip-chip IC manufacturing techniques can be used despite one or more dies of the IC including large areas of analog circuitry. The design rules relating to solder bump density need not be violated as solder bumps may be implemented throughout a surface area of a die in vertical alignment with the region of analog circuitry.

In some cases, implementation of a solder bump arrangement in vertical alignment with an analog region within a die does not degrade performance of the analog circuitry within the analog region. In other cases, implementation of a solder bump arrangement in vertical alignment with an analog region within the die improves performance of the analog circuitry within the analog region. More specific aspects of the solder bump arrangements will be described below with reference to the accompanying drawings.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 is a block diagram illustrating a top view of an exemplary multi-die IC (IC) 100. A multi-die IC is an IC that includes two or more dies within a single package. IC 100 is an example of a "stacked die IC" formed by stacking multiple dies. As shown, IC 100 includes an interposer 105, a die 110, a die 115, a die 120, and a package substrate 125. Each of dies 110, 115, and 120 has a bottom surface that is attached to a top surface of interposer 105. In one aspect, dies 110, 115, and 120 are attached to interposer 105 using flip-chip technology. A bottom surface of interposer 105 is attached to a top surface of package substrate 125.

Interposer 105 is a die having a planar surface on which dies 110, 115, and 120 are horizontally stacked. As shown, dies 110, 115, and 120 are located on the planar surface of interposer 105 side-by-side. Although interposer 105 is shown to include three dies in FIG. 1, it should be appreciated that IC 100 is shown for purposes of illustration only. A multi-die IC may include fewer than three dies attached to an interposer or more than three dies attached to an interposer.

Interposer 105 is a die mounting structure, e.g., one type of die mounting structure, that provides a common mounting surface and electrical coupling point for each of dies 110, 115, and 120. The manufacturing of interposer 105 can include one or more process steps that allow the deposition of one or more conductive layers that are patterned to form wires. These conductive layers may be formed of aluminum, gold, copper, nickel, various silicides, and/or the like. Interposer 105 can be manufactured using one or more additional process steps that allow the deposition of one or more dielectric or insulating layer(s) such as, for example, silicon dioxide.

Interposer 105 also may include vias and through vias (TVs). TVs may be through silicon vias (TSVs), through glass vias (TGVs), or other via structures depending upon the particular materials used to implement interposer 105 and the substrate thereof. When interposer 105 is implemented as a passive die, interposer 105 may only have various types of solder bumps, vias, wires, TVs, and under bump metallization (UBM). When implemented as an active die, interposer 105 may include additional process layers forming one or more active devices in reference to electrical devices such as transistors, diodes, etc., that include P-N junctions.

Each of dies 110, 115, and 120 may be implemented as a passive die or an active die including one or more active devices. For example, one or more of dies 110, 115, and 120 may be memory dies, processor (central processing unit) dies configured to execute program code, dies having programmable circuitry, application specific IC dies, mixed signal dies, or the like. In one aspect, each of dies 110, 115, and 120 may be the same or identical. In another aspect, die 110 may be implemented as one type of die, while die 115 is implemented as another different type of die, and die 120 is implemented as yet another different type of die. For example, IC 100 can include a processor die, a programmable IC die, and a memory die coupled to interposer 105. In another example, IC 100 may be formed of two memory dies and a processor die attached to interposer 105. The examples provided herein are for purposes of illustration only and not intended to be limiting.

As used herein, a "programmable die" refers to a die that includes programmable circuitry and, as such, may be programmed to perform specified logic functions. A specific example of a programmable die is a field programmable gate array (FPGA) die. An FPGA die typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuitry and programmable logic circuitry are typically programmed by loading a stream of configuration data into internal configuration memory cells that define how the programmable elements are configured. The configuration data can be read from memory (e.g., from an external PROM) or written into the FPGA die by an external device. The collective states of the individual memory cells then determine the function of the FPGA die.

Another specific example of a programmable die is a complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable dies, the functionality of the die is controlled by data bits provided to the die for that purpose. The data bits can be stored in volatile memory (e.g., static memory cells, as in FPGAs and some CPLDs), in non-volatile memory (e.g., FLASH memory, as in some CPLDs), or in any other type of memory cell.

Other exemplary programmable dies may be implemented in other ways, e.g., using fuse or antifuse technology. The phrase "programmable die" can include, but is not limited to these types of dies and further can encompass dies that are only partially programmable. For example, a programmable die may include a combination of hard-coded transistor logic and a programmable switch fabric that programmably interconnects the hard-coded transistor logic. It should be appreciated that a programmable die may include one or more portions of programmable circuitry and one or more portions of other circuitry not programmable such as analog circuitry or other fixed circuitry such as a hardwired processor or the like.

As pictured, die 110 includes an analog region 130. Analog region 130 includes analog circuits or circuitry. Examples of analog circuits that may be implemented within analog region 130 may include, but are not limited to, switched capacitor filter(s), switched capacitor analog-to-digital converters (ADCs), current sources, e.g., for digital-to-analog converters (DACs), or the like. In any case, analog region 130 is shown for purposes of illustration. Those skilled in the art will appreciate that analog region 130 is implemented within die 110 and, in an actual pictorial view of IC 100, would not be visible from the top view pictured in FIG. 1.

Figure 2:
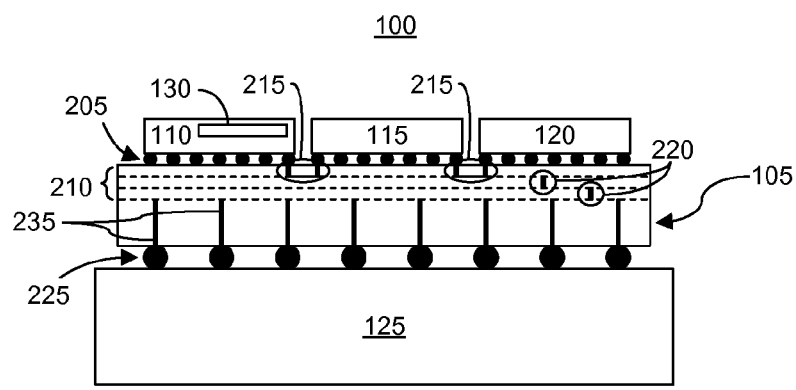
FIG. 2 is a cross-sectional side view of the IC of FIG. 1.

FIG. 2 is a cross-sectional side view of IC 100 of FIG. 1. More particularly, FIG. 2 illustrates a view of IC 100 of FIG. 1 taken along cut-line 2-2. Each of dies 110, 115, and 120 is electrically and mechanically coupled to a first planar surface of interposer 105 via solder bumps 205. In one example, solder bumps 205 are implemented as micro-bumps.

As pictured, one or more of solder bumps 205 are implemented in vertical alignment with analog region 130 of die 110. A solder bump 205 is in vertical alignment with analog region 130 when the solder bump is located within an area on a surface, e.g., a bottom surface, of die 110 that is directly beneath analog region 130. The area on the bottom surface of die 110 that is vertically aligned with analog region 130 is a projection of the outer perimeter of analog region 130 onto the bottom surface of die 110. Thus, any solder bump 205 located within the area defined by the projected perimeter of analog region 130 is said to be in vertical alignment with analog region 130.

Interposer 105 includes one or more conductive layers 210. Conductive layers 210 are illustrated as dashed or dotted lines within interposer 105. Conductive layers 210 are implemented using any of a variety of metal layers as previously described. Conductive layers 210 are processed to form patterned metal layers that implement wires 215 of interposer 105. A wire implemented within interposer 105 that couples at least two different dies, e.g., dies 110 and 115, dies 115 and 120, or dies 110 and 120, is referred to as an inter-die wire.

FIG. 2 shows several wires 215 that are considered inter-die wires for purposes of illustration. Wires 215 pass inter-die signals between dies 110, 115, and/or 120. For example, each of wires 215 couples two different solder bumps 205 beneath different ones of dies 110, 115, and/or 120, thereby allowing the exchange of inter-die signals between dies 110, 115, and/or 120. Wires 215 may be data wires or power supply wires such as ground (Vss) and/or a different or higher voltage potential (Vcc). One or more solder bumps 205, including solder bumps vertically aligned with analog region 130, may be connected to signal wires and/or power supply wires. Further, one or more solder bumps, including solder bumps vertically aligned with analog region 130, may be electrically floating and provide only a mechanical connection between a die and a die mounting structure.

Different ones of conductive layers 210 may be coupled together using vias 220. In general, vias 220 are portions of conductive material, e.g., metal, used to create a vertical conductive path. In this regard, the vertical portions of wires 215 that contact solder bumps 205 are implemented as vias 220. The use of multiple conductive layers to implement interconnects within interposer 105 allows a greater number of signals to be routed and more complex routing of signals to be achieved within interposer 105.

Solder bumps 225 can be used to mechanically and/or electrically couple the bottom planar surface of interposer 105 to package substrate 125. Package substrate 125 is another type of die mounting structure. In one aspect, solder bumps 225 can be implemented as controlled collapse chip connection (C4) balls. Package substrate 125 includes conductive paths (not shown) that couple different ones of solder bumps 225 to one or more nodes beneath package substrate 125. Accordingly, one or more of solder bumps 225 couple circuitry within interposer 105 to nodes external to IC 100 through circuitry or wiring within package substrate 125.

TVs 235 are vias that form an electrical connection that vertically extends through a substantial portion, if not the entirety, of interposer 105. TVs 235, like wires and vias, may be formed of any of a variety of different conductive materials including, but not limited to, copper, aluminum, gold, nickel, various silicides, and/or the like. One or more TVs 235 may be coupled to signal wires, Vss, and/or Vcc. As pictured, each of TVs 235 extends from a bottom surface of interposer 105 up to a conductive layer 210 of interposer 105. TVs 235 further may be coupled to a solder bump 205 through one or more of conductive layers 210 in combination with one or more vias 220.

FIGS. 3-1, 3-2, 3-3, and 3-4 are block diagrams illustrating alternative layouts for a portion of IC 100 of FIGS. 1 and 2. More particularly, FIGS. 3-1, 3-2, 3-3, and 3-4 illustrate alternative layouts, collectively referred to as $Q^N$ layouts, for analog region 130 of die 110. For purposes of illustration, analog region 130 is formed entirely of analog circuitry. As previously noted, analog region 130 may include switched capacitor filter(s), switched capacitor ADCs, DACs, current sources, a combination of one or more or all of the aforementioned circuits, portions thereof, etc. In one aspect, the various blocks pictured in FIGS. 3-1, 3-2, 3-3, and/or 3-4 may represent circuit elements such as, for example, capacitor circuit elements in capacitor arrays, resistor circuit elements resistor arrays, unit current sources in a current source array, or the like. In this regard, analog region 130 may represent only the arrayed circuit elements of a larger portion or region of analog circuitry in die 110.

For purposes of discussion and not limitation, consider the case where FIGS. 3-1, 3-2, 3-3, and 3-4 depict analog region 130 which implements a current source from a plurality of smaller current sources. The current sources, for example, may be implemented as part of a DAC. For instance, the current source of analog region 130 may be implemented as a thermometer current source where current contributions from individual cells are summed and routed to appropriate switches.

Figures 1, 3:
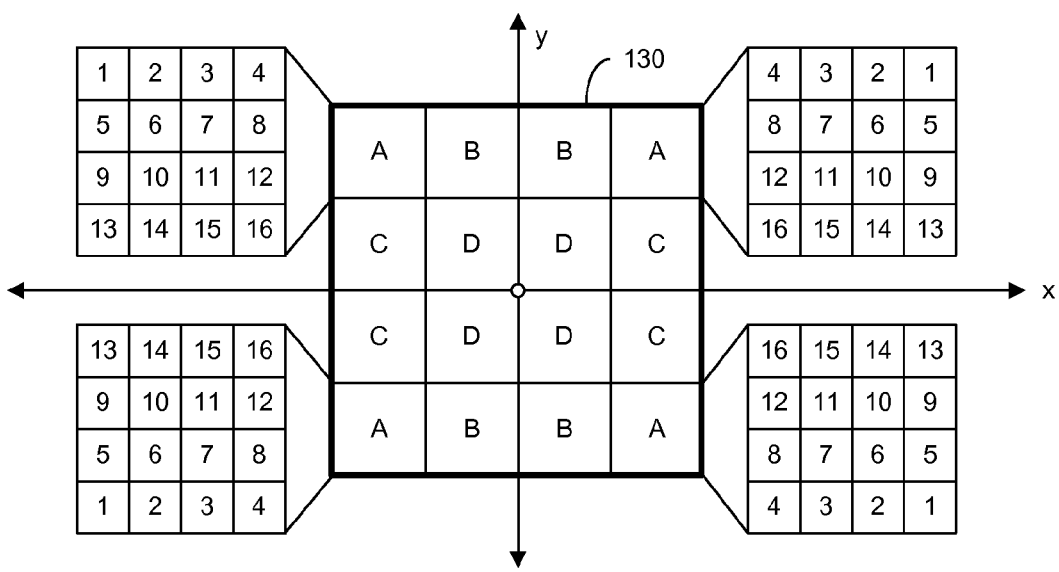
Figures 2, 3:
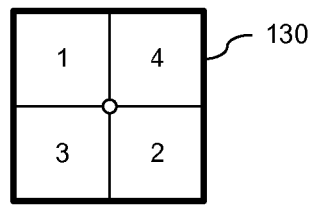

FIG. 3-1 illustrates an example of a quad-quadrant ($Q^2$) layout. In a $Q^2$ layout, the switching sequence of the current sources may be randomized using several different techniques. In one aspect, the individual current sources are implemented in a common centroid configuration, but the switches that control different ones of the cells are randomized or configured for randomized operation. In another aspect, the locations of the cells are randomized, but the switches are ordered or switch in a predetermined order. In either case, the randomization helps to reduce the integral non-linearity (INL) of the transfer function of a DAC.

FIG. 3-1 illustrates an example where analog region 130 is implemented using a common centroid approach. An x-y coordinate system is overlaid upon analog region 130 for purposes of discussion. As shown, each quadrant includes blocks A, B, C, and D. Further, each of blocks A, B, C, and D includes sixteen cells labeled 1-16. Only cells for block A are illustrated, though each of blocks B, C, and D have sixteen cells as noted.

In a common centroid arrangement, the analog circuitry shown is symmetric about both the x-axis and the y-axis. Blocks A, B, C, and D above the x-axis are mirrored below the x-axis. Similarly, blocks A, B, C, and D to the left of the y-axis are mirrored to the right of the y-axis. The same is true of cells within each respective block.

A given current source may include multiple cells from different blocks of analog region 130. For example, a given current source may include cell A1 from each quadrant of region 130. The current source is split in a symmetric manner with respect to both the x-axis and the y-axis. Other current sources may be implemented in similar fashion, i.e., symmetrically about the x-axis and the y-axis, though have a different number of cells as may be required. In the case of a common centroid configuration as illustrated in FIG. 3, the switches that control the current sources would be randomized instead of the location of the current sources.

FIG. 3-1 is provided for purposes of illustration. As such, the example described with reference to FIG. 3-1 is not intended as a limitation. Other layouts may be used to implement analog circuitry within analog region 130 that also benefit from the solder bump arrangements described within this disclosure. Such layouts may or may not utilize a common centroid approach. Further examples are pictured in FIGS. 3-2, 3-3, and 3-4.

Figures 3, 4:
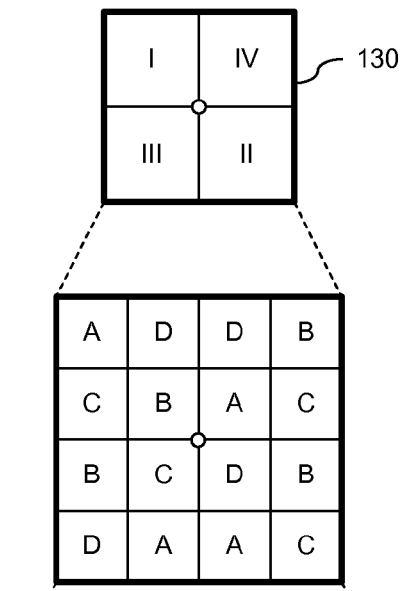
Figure 3:
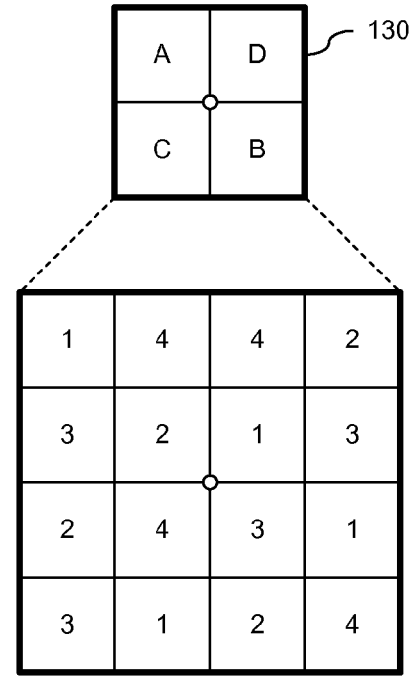
Figure 4:
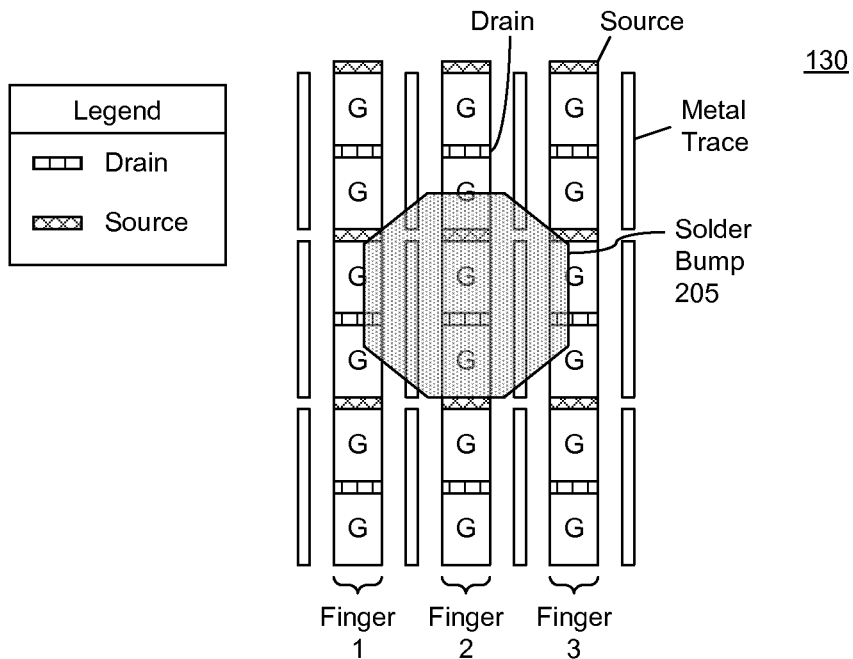

Within each of FIGS. 3-2, 3-3, and 3-4, the x-axis and the y-axis are not shown. The center, or origin, of each structure, however, is illustrated for purposes of reference. FIG. 3-2 is a block diagram illustrating an exemplary $Q^1$ rotated walk layout that may be used to implement analog circuitry within analog region 130. As shown, the layout illustrated in FIG. 3-2 includes blocks 1, 2, 3, and 4.

FIG. 3-3 is a block diagram illustrating an exemplary $Q^2$ rotated walk layout that may be used to implement analog circuitry within analog region 130. FIG. 3-3 illustrates increasing levels of detail where the top level is shown including blocks A, B, C, and D. Each of blocks A, B, C, and D is broken out into further detail and includes one each of blocks, or cells, 1, 2, 3, and 4.

FIG. 3-4 is a block diagram illustrating an exemplary $Q^3$ rotated walk layout that may be used to implement analog circuitry within analog region 130. FIG. 3-4 also illustrates increasing levels of detail where the top level is shown including blocks I, II, III, and IV. Each of blocks I, II, III, and IV is broken out to show further detail and includes one each of blocks A, B, C, and D. Each of blocks A, B, C, and D further is broken out to illustrate additional detail and includes one each of blocks, or cells, 1, 2, 3, and 4. The examples provided are for purposes of illustration and breadth and, as such, are not intended to limit the scope of the inventive arrangements described within this disclosure.

FIG. 4 is a bottom view of a portion of region 130 of FIG. 3. More particularly, FIG. 4 illustrates a multi-finger transistor structure where blocks labeled as "G" represent gates, sources are shaded with cross-hatching, and drains are shaded with vertical lines. Metal traces are also illustrated. The placement of a solder bump 205 is illustrated with respect to the analog circuitry within analog region 130. Solder bump 205, which may be implemented as a micro-bump, is shown using semitransparency to illustrate how solder bump 205 is actually implemented on the bottom surface of die 110 in which analog region 130 is implemented. FIG. 4 illustrates that solder bump 205 is in vertical alignment with analog region 130.

Figure 5:
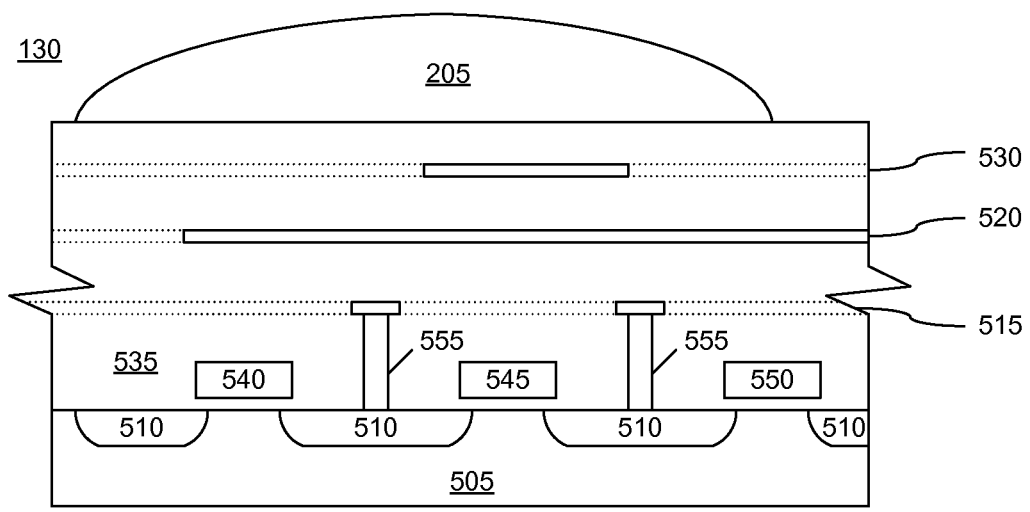
FIG. 5 is a cross-sectional side view of a portion of a die of the IC of FIGS. 1 and 2.

FIG. 5 is a cross-sectional side view of a portion of region 130 within die 110. FIG. 5 is a simplified view illustrating the relative location of solder bump 205 above analog circuitry of die 110. In the example pictured in FIG. 5, the analog circuitry is a portion of a current source. Solder bump 205 may be implemented as a micro-bump formed on a surface, e.g., a bottom surface, of die 110. The view presented in FIG. 5 has been inverted for purposes of clarity and illustration so that solder bump 205, which is formed on a bottom surface of die 110 as illustrated in FIG. 2 is shown at the top of FIG. 5.

As pictured, the portion of die 110 illustrated includes a p-type substrate portion 505 with various n-type regions or wells 510. The area between metal layers 515, 520, and 530 can be an insulative material 535 such as silicon dioxide. Gates 540, 545, and 550 may be implemented using polysilicon. One or more vias 555 may couple portions of the transistors to metal layers 515, 520, and/or 530. As noted, FIG. 5 is a simplified view. As such, the portion of die 110 illustrated in FIG. 5 may include one or more other layers not shown such as UBM layers beneath solder bump 205, other layers above insulative material 535, or the like.

While FIG. 5 presents an example using n-type transistors, it should be appreciated that p-type transistors may be used or included in analog region 130. Further, the particular type of IC manufacturing technology and materials described with reference to FIG. 5 are for purposes of example and not intended as limitations.

Figure 6:
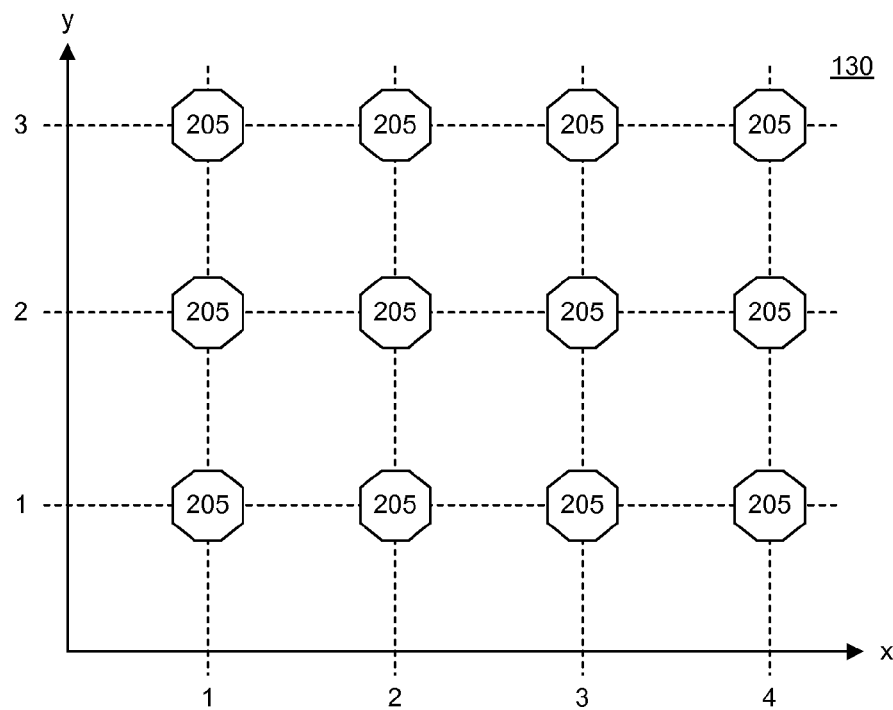
FIG. 6 is an exemplary solder bump arrangement.

FIG. 6 is an exemplary solder bump arrangement for use with an IC. For example, the solder bump arrangement of FIG. 6 can be used with the IC of FIGS. 1 and 2. More particularly, FIG. 6 illustrates a bottom view of a portion of the surface of die 110 in vertical alignment with analog region 130. For purposes of illustration, an x-y coordinate system is overlaid to illustrate the distribution or arrangement of solder bumps 205. The array of solder bumps 205 shown in FIG. 6 includes a plurality of columns (e.g., columns 1, 2, 3, and 4) and a plurality or rows (e.g., rows 1, 2, and 3) As pictured, the columns of solder bumps 205 are perpendicular to the rows of solder bumps 205.

Horizontal spacing refers to the distance between consecutive, or adjacent, ones of solder bumps 205 located in a same row. Horizontal spacing also is referred to as the "x-pitch." For example, adjacent solder bumps include the solder bumps in row 3 located at coordinates (1, 3) and (2, 3). In one example, horizontal spacing between adjacent solder bumps 205 may be specified in accordance with the design rules for the particular IC manufacturing process that is used. Horizontal spacing may be a minimum distance allowed, a maximum distance allowed, or some distance between the minimum and maximum allowed per the design rules specifying density of solder bumps 205.

Vertical spacing refers to the distance between consecutive, or adjacent, ones of solder bumps 205 located in a same column. Vertical spacing also is referred to as the "y-pitch." For example, adjacent solder bumps include the solder bumps in column 1 located at coordinates (1, 3) and (1, 2). In one example, vertical spacing between adjacent solder bumps 205 may be specified in accordance with the design rules for the particular IC manufacturing process that is used. Vertical spacing may be a minimum distance allowed, a maximum distance allowed, or some distance between the minimum and maximum allowed per the design rules specifying density of solder bumps.

In one aspect, one or more or all of solder bumps 205 in vertical alignment with analog region 130 may be coupled to a power supply signal. The power supply signal may be Vss. In another example, the power supply signal may be Vcc. In still another example, one or more or all of solder bumps 205 in vertical alignment with analog region 130 may be coupled to data signals within die 110 and/or interposer 105. In yet another aspect, one or more or all of solder bumps 205 in vertical alignment with analog region 130 may be mechanical solder bumps. As mechanical solder bumps, the solder bumps do not form an electrical connection between die and/or die mounting structure, e.g., are open circuits, floating nodes, or are completely unconnected from any other circuitry of the IC. As such, a mechanical solder bump serves only to form a mechanical connection between die and die mounting structure for purposes of structural integrity.

FIG. 6 illustrates a solder bump arrangement in which the solder bumps are placed in rows that are perpendicular to the columns. Accordingly, the x-pitch and the y-pitch remain constant. Further, no offset is applied to either rows or to columns. Other solder bump arrangements, however, may be implemented in which one or more offsets may be used. An offset applied to the x-coordinate of a solder bump is referred to as "offset_X." An offset applied to the y-coordinate of a solder bump is referred to as "offset_Y."

In some cases, an offset, whether for the x and/or y-coordinates, may be applied uniformly to a plurality of different solder bumps. For example, an offset may be applied to all solder bumps in a column uniformly, all solder bumps in a row uniformly, or to all solder bumps in both columns and rows uniformly. In such cases, the x-pitch and the y-pitch between adjacent solder bumps in a same row or in a same column remains constant. In other cases, an offset, whether for the x and/or y-coordinates of solder bumps, may be applied on a per-solder bump basis. For example, the offset may be varied from one solder bump to another and, further, be varied in a non-linear manner. The x-pitch and/or y-pitch may be different for each pair of adjacent solder bumps of a row and/or column, as the case may be, to which an offset is applied. In such cases, the x-pitch and/or y-pitch does not remain constant. Offsets as applied to solder bump arrangements are described in further detail with reference to FIGS. 7-11.

Figure 7:
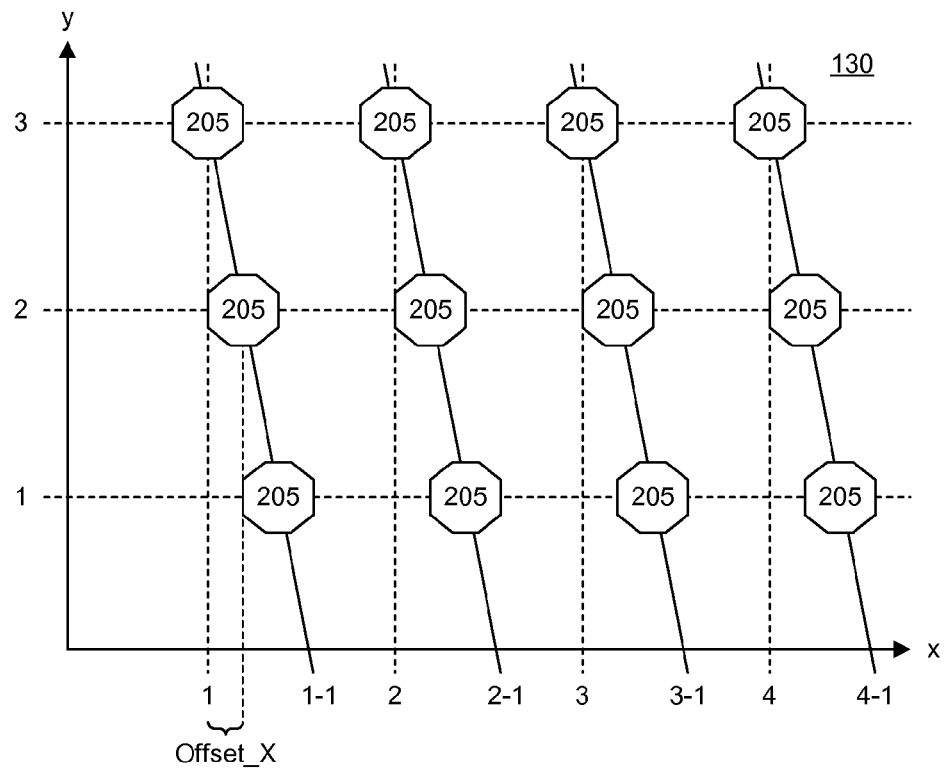
FIG. 7 is another exemplary solder bump arrangement.

FIG. 7 is another exemplary solder bump arrangement for use with an IC. The solder bump arrangement of FIG. 7 can be used with the IC of FIGS. 1 and 2. FIG. 7 illustrates a bottom view of a portion of die 110 that is in vertical alignment with analog region 130. For purposes of illustration, an x-y coordinate system is overlaid to illustrate the distribution or arrangement of solder bumps 205. The arrangement of solder bumps 205 illustrated in FIG. 7 may be used as an alternative to that described with reference to FIG. 6.

As shown, each row is offset along the x-axis from the row immediately above by a predetermined amount referred to as "offset_X." Offset_X is less than the horizontal spacing between solder bumps. Horizontal and vertical spacing may be maintained as constant after the offset is applied for each row. For example, row 3 of the solder bumps begins at coordinate (1, 3). The next solder bump in row 3 has a coordinate of (2, 3). Row 2 of the solder bumps begins at coordinate (1+offset_X, 2). The next solder bump in row 2 has a coordinate of (2+offset_X, 2). Row 1 of solder bumps will begin at coordinate (1+(2*offset_X), 1). The next solder bump in row 1 has a coordinate of (2+(2*offset_X), 1).

The x-pitch and y-pitch may be set in accordance with design rules in effect for the particular IC fabrication technology being used. In one aspect, x-pitch and/or y-pitch may be set to the smallest spacing allowed, the largest spacing allowed, or some spacing between. As noted, offset_X is less than the horizontal spacing or x-pitch. Further, the array of solder bumps 205 shown in FIG. 7 includes a plurality of rows (e.g., rows 1, 2, and 3) and a plurality of columns. The columns are represented by lines 1-1, 2-1, 3-1, and 4-1. As shown, while solder bumps 205 still are arranged in columns, the columns are not perpendicular to the rows due to the offset of each respective row. In the example of FIG. 7, offset_X is added to the x-coordinate of the effected solder bumps. In another example, offset_X may be subtracted.

In one aspect, offset_X may be measured in terms of fingers of the transistors of the current source implemented in analog region 130. Thus, offset_X may be a single finger, two fingers, or the like. A finger may be defined, at least in terms of size, as the gate polysilicon area of a transistor. As such, the finger has a defined width (W) and length (L) that corresponds to the gate polysilicon area. In one example, offset_X may be set to a value that is greater than W. When offset_X is more than one finger, it should be appreciated that the distance denoted by offset_X includes any necessary area or spacing between adjacent transistors in the horizontal direction in accordance with design rules for the IC manufacturing technology being used.

In one aspect, one or more or all of solder bumps 205 in vertical alignment with analog region 130 may be coupled to a power supply signal. The power supply signal may be Vss. In another example, the power supply signal may be Vcc. In still another example, one or more or all of solder bumps 205 in vertical alignment with analog region 130 may be coupled to data signals within die 110 and/or interposer 105. In yet another aspect, one or more or all of solder bumps 205 in vertical alignment with analog region 130 may be mechanical solder bumps.

Figure 8:
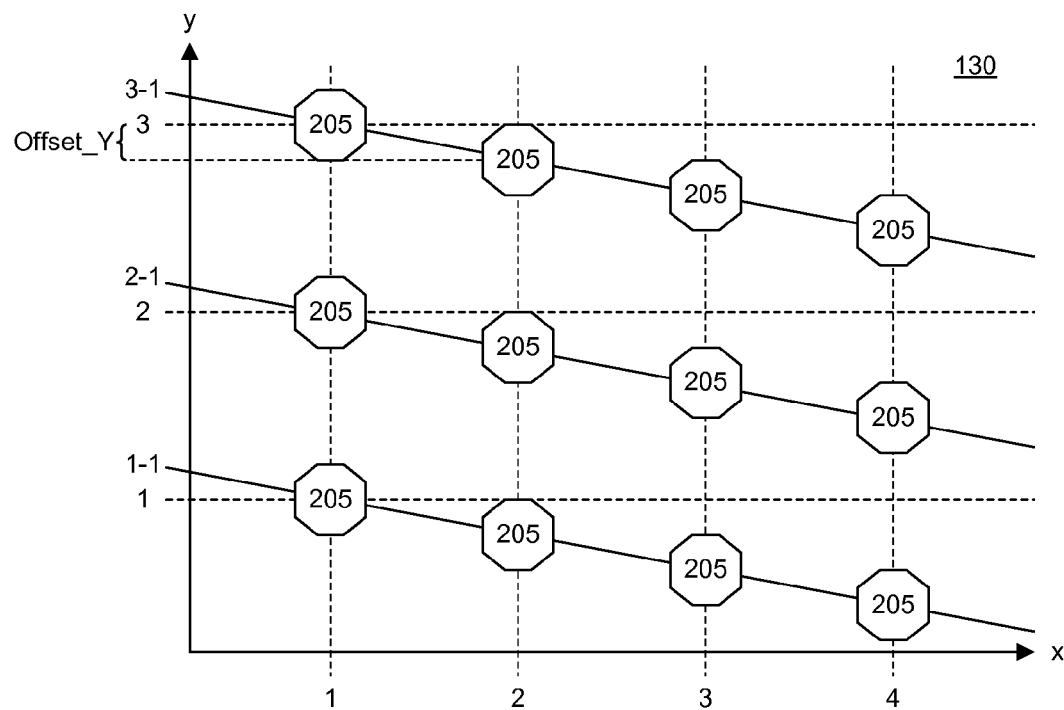
FIG. 8 is another exemplary solder bump arrangement.

FIG. 8 is another exemplary solder bump arrangement for use with an IC. The solder bump arrangement of FIG. 8 can be used with the IC of FIGS. 1 and 2. FIG. 8 illustrates a bottom view of a portion of die 110 that is in vertical alignment with analog region 130. Again, for purposes of illustration, an x-y coordinate system is overlaid to illustrate the distribution or arrangement of solder bumps 205. The arrangement of solder bumps 205 illustrated in FIG. 8 may be used as an alternative to those described with reference to FIGS. 6 and 7.

Whereas FIG. 7 illustrated an example where rows were offset, FIG. 8 illustrates an example where columns are offset. As shown, each column is offset along the y-axis from the column immediately to the left by a predetermined amount referred to as "offset_Y." Offset_Y is less than the vertical spacing between solder bumps. Horizontal and vertical spacing may be maintained as constant after the offset is applied for each column. For example, column 1 of the solder bumps begins at coordinate (1, 3). The other solder bumps in column 1 have coordinates of (1, 2) and (1, 1). Column 2 of the solder bumps begins at coordinate (2, 3−offset_Y). The next two solder bumps in column 2 have coordinates of (2, 2−offset_Y) and (2, 1−offset_Y). Column 3 of solder bumps will begin at coordinate (3, 3−(2*offset_Y)). The next solder bump in column 3 has a coordinate of (3, 2−(2*offset_Y)), etc.

The x-pitch and y-pitch may be set in accordance with design rules in effect for the particular IC fabrication technology being used. In one aspect, x-pitch and/or y-pitch may be set to the smallest spacing allowed, the largest spacing allowed, or some spacing between. In addition, the array of solder bumps 205 shown in FIG. 8 includes a plurality of columns (e.g., columns 1, 2, 3, and 4) and a plurality of rows. The rows are represented by lines 1-1, 2-1, and 3-1. As shown, while solder bumps 205 still are arranged in columns, the columns are not perpendicular to the rows due to the offset of each respective column. In the example of FIG. 8, offset_Y is subtracted from the y-coordinate of the effected solder bumps. In another example, offset_Y may be added.

Offset_Y, like offset_X, may be measured in terms of fingers of the transistors of the current source implemented in analog region 130. Thus, the offset may be a single finger, two fingers, or the like. In one example, offset_Y may be set to a value that is greater than L, in reference to the finger. As noted, however, offset_Y still would be less than the vertical spacing or y-pitch. When offset_Y is more than one finger, it should be appreciated that the distance denoted by offset_Y includes any necessary area or spacing between adjacent transistors in the vertical direction in accordance with the design rules for the IC manufacturing technology being used.

In one aspect, one or more or all of solder bumps 205 in vertical alignment with analog region 130 may be coupled to a power supply signal. The power supply signal may be Vss. In another example, the power supply signal may be Vcc. In still another example, one or more or all of solder bumps 205 in vertical alignment with analog region 130 may be coupled to data signals within die 110 and/or interposer 105. In yet another aspect, one or more or all of solder bumps 205 in vertical alignment with analog region 130 may be mechanical solder bumps.

Figure 9:
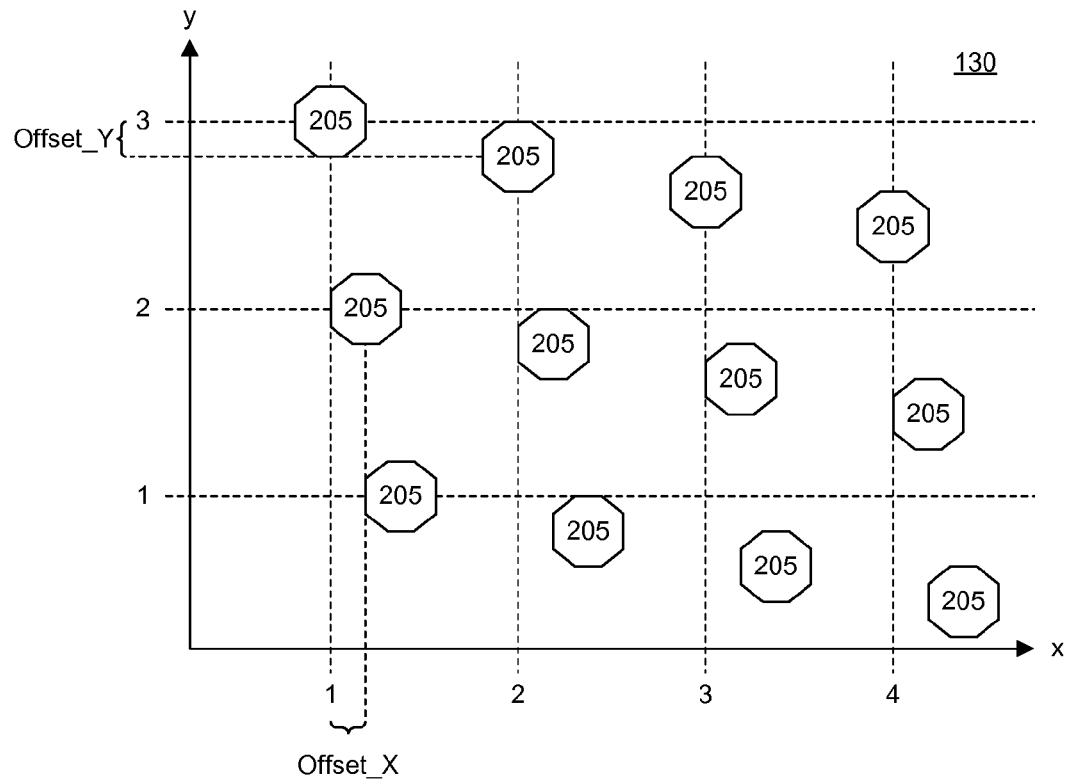
FIG. 9 is another exemplary solder bump arrangement.

FIG. 9 is another exemplary solder bump arrangement for use with an IC. The solder bump arrangement of FIG. 9 can be used with the IC of FIGS. 1 and 2. FIG. 9 illustrates a bottom view of a portion of die 110 that is in vertical alignment with analog region 130. Again, for purposes of illustration, an x-y coordinate system is overlaid to illustrate the distribution or arrangement of solder bumps 205. The arrangement of solder bumps 205 illustrated in FIG. 9 may be used as an alternative to those described with reference to FIGS. 6-8.

FIG. 9 illustrates an example where both rows and columns are offset. As shown, each row is offset along the x-axis from the row immediately above by offset_X. Further, each column is offset along the y-axis from the column immediately to the left by offset_Y. As noted, offset_X may be less than the horizontal spacing between adjacent solder bumps in the same row, while offset_Y may be less than the vertical spacing between adjacent solder bumps in the same column.

Horizontal spacing may be maintained as constant after the offset is applied to each row. Similarly, vertical spacing may be maintained as constant after the offset is applied to each column. For example, column 1 includes solder bumps at the coordinates (1, 3), (1+offset_X, 2), and (1+(2*offset_X), 1). Column 2 includes solder bumps at the coordinates (2, 3−offset_Y), (2+offset_X, 2−offset_Y), and (2+(2*offset_X), 1−offset_Y).

As noted, the x-pitch and y-pitch may be set in accordance with design rules in effect for the particular IC fabrication technology being used. In one aspect, x-pitch and/or y-pitch may be set to the smallest spacing allowed, the largest spacing allowed, or some spacing between.

Both offset_X and offset_Y may be measured in terms of fingers of the transistors of the current source implemented in analog region 130. Thus, the offset may be a single finger, two fingers, or the like. In one example, offset_X may be equal to offset_Y. In another example, offset_X does not equal offset_Y. In that case, offset_X may be greater than or less than offset_Y. In addition, while the array of solder bumps 205 shown in FIG. 9 includes a plurality of columns and a plurality of rows, the rows and columns are not perpendicular to one another.

In one aspect, one or more or all of solder bumps 205 in vertical alignment with analog region 130 may be coupled to a power supply signal. The power supply signal may be Vss. In another example, the power supply signal may be Vcc. In still another example, one or more or all of solder bumps 205 in vertical alignment with analog region 130 may be coupled to data signals within die 110 and/or interposer 105. In yet another aspect, one or more or all of solder bumps 205 in vertical alignment with analog region 130 may be mechanical solder bumps. As noted, offsets, whether offset_X or offset_Y, may be added or subtracted from a given coordinate. The application of offsets is not intended to be restricted to the examples provided.

The examples illustrated in FIGS. 6-9 utilize a constant spacing between solder bumps for both the x-pitch and the y-pitch. As discussed, by varying the offset applied on a per solder bump basis, solder bump arrangements may be implemented in which the x-pitch and/or the y-pitch does not remain constant. The variation in the offset that is applied may be non-linear.

Figure 10:
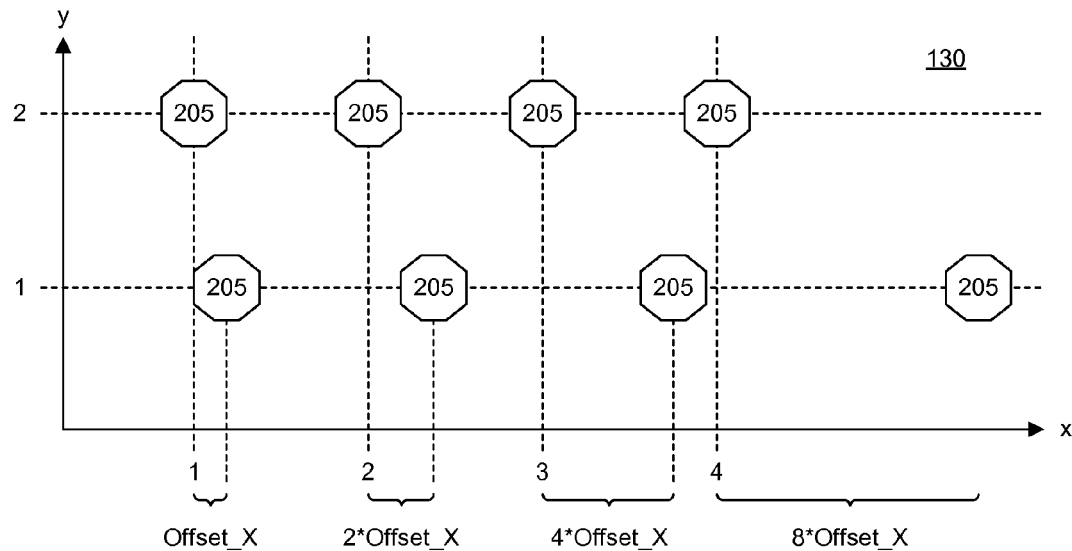
FIG. 10 is another exemplary solder bump arrangement.

FIG. 10 is another exemplary solder bump arrangement for use with an IC. The solder bump arrangement of FIG. 10 can be used with the IC of FIGS. 1 and 2. FIG. 10 illustrates a bottom view of a portion of die 110 that is in vertical alignment with analog region 130. Again, for purposes of illustration, an x-y coordinate system is overlaid to illustrate the distribution or arrangement of solder bumps 205. The arrangement of solder bumps 205 illustrated in FIG. 10 may be used as an alternative to those described with reference to FIGS. 6-9.

FIG. 10 illustrates an example where offset_X is varied from one solder bump to the next in the same row. Further, offset_X is varied in a non-linear manner. As shown, the solder bumps of row 2 have a constant x-pitch. The coordinates of the solder bumps in row 2 are (1, 2), (2, 2), (3, 2), and (4, 2). In row 1, however, the x-pitch does not remain constant. The first solder bump of row 1 has an offset of offset_X. The second solder bump of row 1 has an offset of 2*offset_X. The third solder bump of row 1 has an offset of 4*offset_X, etc. The coordinates of solder bumps of row 1 are (1+offset_X, 1), (2+(2*offset_X), 1), (3+(4*offset_X), 1), and (4+(8*offset_X), 1). As noted, though the offsets are added in this example, offsets may instead be subtracted.

In one aspect, one or more or all of solder bumps 205 in vertical alignment with analog region 130 may be coupled to a power supply signal. The power supply signal may be Vss. In another example, the power supply signal may be Vcc. In still another example, one or more or all of solder bumps 205 in vertical alignment with analog region 130 may be coupled to data signals within die 110 and/or interposer 105. In yet another aspect, one or more or all of solder bumps 205 in vertical alignment with analog region 130 may be mechanical solder bumps.

Figure 11:
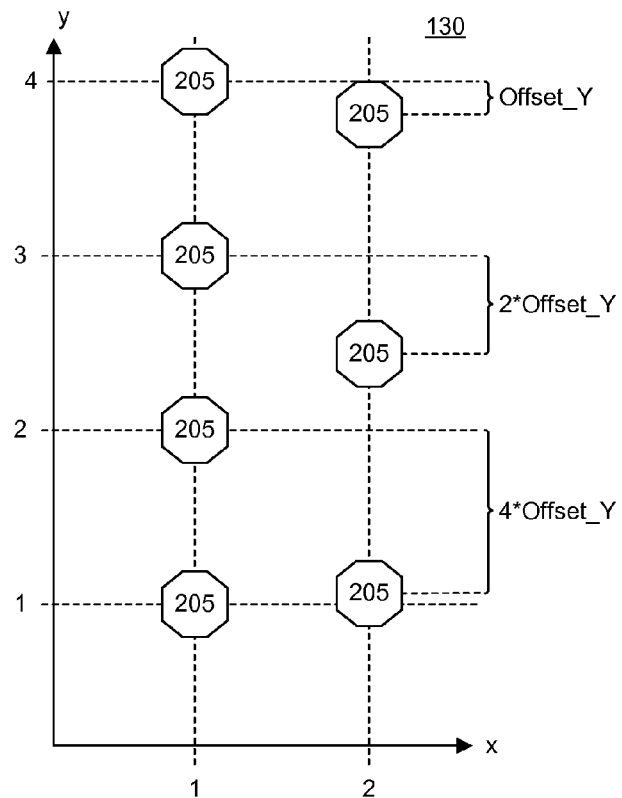
FIG. 11 is another exemplary solder bump arrangement.

FIG. 11 is another exemplary solder bump arrangement for use with an IC. The solder bump arrangement of FIG. 11 can be used with the IC of FIGS. 1 and 2. FIG. 11 illustrates a bottom view of a portion of die 110 that is in vertical alignment with analog region 130. Again, for purposes of illustration, an x-y coordinate system is overlaid to illustrate the distribution or arrangement of solder bumps 205. The arrangement of solder bumps 205 illustrated in FIG. 11 may be used as an alternative to those described with reference to FIGS. 6-10.

FIG. 11 illustrates an example where offset_Y is varied from one solder bump to the next in the same column. Further, offset_Y is varied in a non-linear manner. As shown, the solder bumps of column 1 have a constant y-pitch. The coordinates of the solder bumps in row 1 are (1, 4), (1, 3), (1, 2), and (1, 1). In column 2, however, the y-pitch does not remain constant. The first solder bump of column 2 has an offset of offset_Y. The second solder bump of column 2 has an offset of 2*offset_Y. The third solder bump of column 2 has an offset of 4*offset_Y, etc. The coordinates of solder bumps of column 2 are (2, 4−offset_Y), (2, 3−(2*offset_Y)), and (2, 2−(4*offset_Y)). While offsets are subtracted in the example of FIG. 11, offset_Y may be added instead.

In one aspect, one or more or all of solder bumps 205 in vertical alignment with analog region 130 may be coupled to a power supply signal. The power supply signal may be Vss. In another example, the power supply signal may be Vcc. In still another example, one or more or all of solder bumps 205 in vertical alignment with analog region 130 may be coupled to data signals within die 110 and/or interposer 105. In yet another aspect, one or more or all of solder bumps 205 in vertical alignment with analog region 130 may be mechanical solder bumps.

Referring to the case of a DAC, utilizing a solder bump arrangement as described with reference to FIG. 6 over the analog circuitry may provide an improvement in INL for the DAC compared to a DAC implementation where no solder bumps are placed in vertical alignment with the analog circuitry. As an example, formation of solder bumps in vertical alignment with the analog circuitry of the DAC as described with reference to FIG. 6 may provide an improvement from 4 LSBs to 16 LSBs on a 16 bit scale. The current sources of the DAC may be implemented as illustrated and described with reference to FIG. 3-1, e.g., using a common centroid arrangement, FIG. 3-2, 3-3, 3-4, or other arrangement. Utilizing a solder bump arrangement that employs offset as illustrated in FIGS. 7-12 over the analog circuitry or portions thereof may provide even greater improvement in INL for a DAC than described with reference to FIG. 6.

Figure 12:
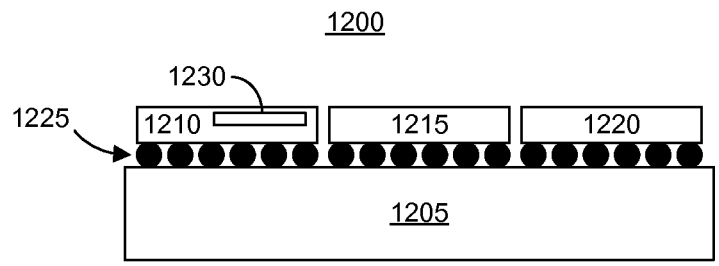
FIG. 12 is a cross-sectional side view of another IC.

FIG. 12 is a cross-sectional side view of an IC 1200. As shown, IC 1200 includes a plurality of dies 1210, 1215, and 1220 mounted on a die mounting structure 1205. In this example, die mounting structure 1205 is a package substrate. Dies 1210, 1215, and 1220 are attached to die mounting structure 1205 through a plurality of solder bumps 1225. Solder bumps 1225, for example, may be C4 bumps. In this example, die 1210 includes an analog region 1230 substantially as described with reference to analog region 130. One or more of solder bumps 1225 can be vertically aligned with analog region 1230. Of solder bumps 1225 that are vertically aligned with analog region 1230, any of the various solder bump arrangements described herein, e.g., with reference to FIGS. 6-11, can be used. FIG. 12 illustrates that the techniques described within this disclosure may be applied to the case of dies mounted on a package substrate where no interposer is used.

The inventive arrangements described within this disclosure may improve performance of a multi-die IC formed using flip-chip technology when one or more of the dies includes a large portion of analog circuitry. Solder bump arrangements may be formed throughout a surface of a die in vertical alignment with the analog circuitry implemented within the die. The various solder bump arrangements described facilitate improved performance of the analog circuitry in terms of reduced INL in the case of DACs.

In one aspect, the solder bump arrangements illustrated within this disclosure seek to stagger rows, columns, both rows and columns, and/or individual solder bumps so that stress induced in devices of the analog circuitry is spread among the devices so as to equally stress the various devices. For example, the horizontal spacing (e.g., x-pitch) of solder bumps may be chosen so that the total stress on each column of fingers averages out to a same value. The vertical spacing (e.g., y-pitch) of solder bumps may be chosen so that the location of the solder bumps shifts have a same average stress effect on each row. The offset(s) utilized from row-to-row and/or from column-to-column avoid error accumulation effects.

In one example, solder bump density, whether or not rows and/or columns are offset, may be set to approximately 14%. This value, however, is provided for purposes of illustration only. Solder bump densities greater than 14% and solder bump densities lower than 14% may result in improved operation of analog circuitry.

Figure 13:
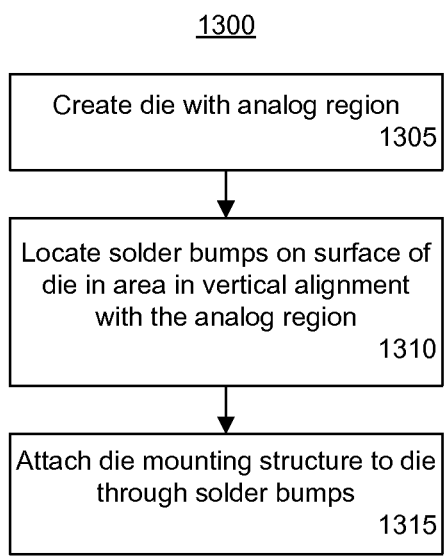
FIG. 13 is a flow chart illustrating an exemplary method of manufacturing an IC.

FIG. 13 is a flow chart illustrating an exemplary method 1300 of manufacturing an IC. In creating the IC, any of the various solder bump arrangements described within this disclosure may be used. For purposes of illustration and not limitation, FIG. 13 illustrates only a simplified manufacturing process.

Method 1300 can begin in block 1305, where a die is created. The die can be created as a multi-layered semiconductor structure using standard IC manufacturing techniques well known in the art. As part of die creation, an analog region is implemented within the die. The analog region includes analog circuitry. Any of the various types of analog circuitry, or portions thereof, described within this disclosure may be implemented. Though the die includes an analog region, it should be appreciated that the die also may include other types of circuitry such as digital circuitry.

In block 1310, solder bump formation is performed. Solder bumps are located, or implemented, on a surface of the die. In one aspect, the solder bumps are located within an area of the surface of the die that is in vertical alignment with the analog region located therein. The solder bumps in vertical alignment with the analog region may be implemented in conformance with any of the solder bump arrangements described within this disclosure. Further, it should be appreciated that the solder bump arrangement utilized within the area in vertical alignment with the analog region may be different than the solder bump arrangement or solder bump pattern that is utilized or implemented on the surface of the die outside of the area in vertical alignment with the analog region.

In block 1315, the die can be attached to a die mounting structure. In one example, the die mounting structure is a package substrate. In another aspect, the die mounting structure is an interposer. In any case, a first surface of the die mounting structure can be attached to a first surface of the die using the plurality of solder bumps.

As part of solder bump formation of block 1310 and/or the attachment process of block 1315, solder bump connections are configured or implemented. In one aspect, one or more or all of the solder bumps in the area in vertical alignment with the analog region are maintained as mechanical solder bumps. In another aspect, one or more or all of the solder bumps in the area in vertical alignment with the analog region are coupled to a power supply voltage. In still another aspect, one or more or all of the solder bumps in the area in vertical alignment with the analog region can be coupled to data signals.

It should be appreciated that various combinations of the aforementioned connection also may be implemented. For example, one or more solder bumps in the area described may be mechanical solder bumps, while one or more other solder bumps in the area are coupled to a power supply voltage. One or more solder bumps in the area may be mechanical solder bumps while one or more other solder bumps in the area may be coupled to data signals. One or more solder bumps in the area may be coupled to a power supply voltage, while one or more other solder bumps in the area may be coupled to data signals. In yet another example, one or more solder bumps in the area may be mechanical solder bumps, while one or more other solder bumps in the area may be coupled to data signals, while one or more other solder bumps in the area may be coupled to a power supply voltage.

Depending upon the implementation of the die mounting structure, the inventive arrangements disclosed herein may be applied to a single die IC structure where the die is attached to a package substrate or a multi-die IC structure. In the case of a multi-die IC structure, the two or more dies may be attached to a package substrate. In an alternative multi-die IC structure, the two or more dies may be attached to an interposer, which is in turn attached to a package substrate. One or more or all of the dies in the multi-die IC structure may include an analog region with solder bump arrangements as described within this disclosure.

For purposes of explanation, specific nomenclature is set forth to provide a thorough understanding of the various inventive concepts disclosed herein. The terminology used herein, however, is for the purpose of illustrating the features described and is not intended to be limiting.

For example, the terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. For example, a power supply signal carries a power supply voltage or power supply voltage potential. The term power supply signal may be used interchangeably with the term power supply voltage or power supply voltage potential. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

The flowchart and block diagrams in the Figures illustrate the architecture, functionality, and operation of possible implementations of process(es), machine(s), manufacture(s), and/or systems utilizing one or more of the features described herein. In some alternative implementations, the functions noted in the blocks may occur out of the order noted in the figures. For example, two blocks shown in succession may be executed substantially concurrently, or the blocks may sometimes be executed in the reverse order, depending upon the functionality involved.

The corresponding structures, materials, acts, and equivalents of all means or step plus function elements in the claims below are intended to include any structure, material, or act for performing the function in combination with other claimed elements as specifically claimed.

The features disclosed within this specification can be embodied in other forms without departing from the spirit or essential attributes thereof. Accordingly, reference should be made to the following claims, rather than to the foregoing specification, as indicating the scope of such features and implementations.

What is claimed is:

1. An integrated circuit, comprising:
an analog region of a die of the integrated circuit comprising analog circuitry; and
a plurality of solder bumps implemented on a surface of the die in an area in vertical alignment with the analog region of the die;
wherein the plurality of solder bumps comprises:
a first column of solder bumps with constant spacing; and
a second column of solder bumps parallel to the first column of solder bumps;
wherein the second column of solder bumps is offset from the first column of solder bumps in a direction parallel to the second column of solder bumps; and
wherein vertical spacing between adjacent solder bumps in the second column varies nonlinearly with an increasing vertical offset that doubles between consecutive pairs of solder bumps in the second column.

2. The integrated circuit of claim 1, wherein the analog circuitry comprises a plurality of current sources.

3. The integrated circuit of claim 2, wherein the plurality of current sources are arranged in a common centroid layout.

4. The integrated circuit of claim 1, wherein at least a portion of the analog circuitry comprises a plurality of circuit elements arranged in a $Q^N$ layout.

5. The integrated circuit of claim 1, wherein the plurality of solder bumps comprises:
a first row of solder bumps; and
a second row of solder bumps;
wherein the second row is offset from the first row of solder bumps in a direction parallel to the second row of solder bumps.

6. The integrated circuit of claim 5, wherein horizontal spacing between adjacent solder bumps in the second row is constant.

7. The integrated circuit of claim 5, wherein horizontal spacing between adjacent solder bumps in the second row varies.

8. The integrated circuit of claim 1, wherein the plurality of solder bumps comprises:
a first row of solder bumps; and
a second row of solder bumps;
wherein solder bumps in the first row and the second row are arranged forming a first column of solder bumps and a second column of solder bumps; and
wherein at least one of the second row of solder bumps is offset from the first row of solder bumps or the second column of solder bumps is offset from the first column of solder bumps and the offset is at least one finger of a transistor structure.

9. The integrated circuit of claim 1, further comprising:
a die mounting structure having a first surface;
wherein a first surface of the die is attached to the first surface of the die mounting structure using a plurality of solder bumps.

10. The integrated circuit of claim 9, wherein the die mounting structure is an interposer.

11. The integrated circuit of claim 9, wherein the die mounting structure is a package substrate.

12. The integrated circuit of claim 1, wherein at least one of the solder bumps of the plurality of solder bumps is coupled to a power supply voltage.

13. The integrated circuit of claim 1, wherein at least one of the solder bumps of the plurality of solder bumps is coupled to a data signal.

14. The integrated circuit of claim 1, wherein at least one of the solder bumps of the plurality of solder bumps is a mechanical solder bump.

15. The integrated circuit of claim 1, wherein the analog circuitry comprises at least one of a plurality of resistors, a plurality of capacitors, or a plurality of inductors.

16. An integrated circuit, comprising:
an analog region of a die of the integrated circuit comprising analog circuitry; and
a plurality of solder bumps implemented on a surface of the die in an area in vertical alignment with the analog region of the die;
wherein the plurality of solder bumps comprises:
a first row of solder bumps with constant spacing; and
a second row of solder bumps parallel to the first row of solder bumps;
wherein the second row is offset from the first row of solder bumps in a direction parallel to the second row of solder bumps; and
wherein horizontal spacing between adjacent solder bumps in the second row varies nonlinearly with an increasing horizontal offset that doubles between consecutive pairs of solder bumps in the second row.

17. The integrated circuit of claim 16, wherein the analog circuitry comprises a plurality of current sources.

18. The integrated circuit of claim 16, wherein the plurality of solder bumps comprises:
a first column of solder bumps; and
a second column of solder bumps;
wherein the second column of solder bumps is offset from the first column of solder bumps in a direction parallel to the second column of solder bumps.

19. The integrated circuit of claim 18, wherein vertical spacing between adjacent solder bumps in the second column is constant.

20. The integrated circuit of claim 18, wherein vertical spacing between adjacent solder bumps in the second column varies.

* * * * *